United States Patent [19]
Edelstein et al.

[11] Patent Number: 5,952,674
[45] Date of Patent: Sep. 14, 1999

[54] TOPOGRAPHY MONITOR

[75] Inventors: Daniel C. Edelstein, New Rochelle; Glenn A. Biery, Hyde Park, both of N.Y.

[73] Assignee: International Business Machines Corporation, Armonk, N.Y.

[21] Appl. No.: 09/044,047

[22] Filed: Mar. 18, 1998

[51] Int. Cl.[6] .......................... H01L 23/58; G01R 31/02
[52] U.S. Cl. ........................... 257/48; 324/691; 324/765
[58] Field of Search ............................. 257/48; 324/765, 324/691; 438/14, 17–18

[56] References Cited

U.S. PATENT DOCUMENTS

| | | | |
|---|---|---|---|
| 4,819,038 | 4/1989 | Alt | 257/10 |
| 4,835,466 | 5/1989 | Maly et al. | 324/537 |
| 4,918,377 | 4/1990 | Buehler et al. | 324/691 |
| 4,933,635 | 6/1990 | Deutsch et al. | 324/766 |
| 5,051,690 | 9/1991 | Maly et al. | 324/537 |
| 5,264,377 | 11/1993 | Chesire et al. | 438/11 |
| 5,448,179 | 9/1995 | Burns | 438/17 |
| 5,532,600 | 7/1996 | Hoshino | 324/537 |
| 5,543,633 | 8/1996 | Losavio et al. | 257/48 |
| 5,561,367 | 10/1996 | Goettling et al. | 324/158.1 |
| 5,615,216 | 3/1997 | Saeki | 371/22.1 |
| 5,640,099 | 6/1997 | Sanada | 324/752 |
| 5,723,874 | 3/1998 | Baker et al. | 257/48 |
| 5,801,394 | 9/1998 | Isobe | 257/48 |

FOREIGN PATENT DOCUMENTS 2-051245  2/1990  Japan .

OTHER PUBLICATIONS

"Addressable Defect Monitor Design Utilizing Photo–Emitting Faults Location" IBM Technical Disclosure Bulletin, V. 30, No. 4, Sep. 1987, pp. 1735–1737.

*Primary Examiner*—John Guay
*Attorney, Agent, or Firm*—Alison D. Mortinger; Jay H. Anderson

[57] ABSTRACT

An integrated circuit wafer topography monitor is disclosed for sensing mis-processing in the fabrication of integrated circuits. In particular, the monitor senses unacceptable variations in layer planarity resulting from over polishing, over etching, scratches and mishandling. The topography monitor may be placed within the chip active area, the chip kerf area or in unutilized areas of the wafer such as a partial chip site. The monitor is formed when, first a conformal insulator is deposited over the topography of interest. Then, runs of wire are formed in the conformal insulator by a damascene or similar process. The wire runs are formed directly above the topography of interest. A puddle of metal is formed corresponding to any unacceptably non-planar topography. The puddle electrically couples the wires together. This effects a change in the metal runs which may be sensed as an electrical short or change in resistance. The topography of interest is manipulated by design to be representative of corresponding pattern factors found in the active chip area. This then allows the electrically sensed puddles to be indicative of mis-processing to be found in the active chip area.

12 Claims, 6 Drawing Sheets

TOPOGRAPHY MONITOR

FIELD OF THE INVENTION

The present invention relates generally to fault detection in electronic circuits and components, and in particular, to testing in integrated circuit chips for the existence, or location, of an electrical short which causes two electrical conductors to come in contact unintentionally as the result of their mis-processing in manufacturing.

BACKGROUND OF THE INVENTION

The testing of manufactured electronics has long been an area of focus in the electronics industry. The importance of testing in the manufacture of semiconductor integrated circuit (IC) chips has escalated because of ever increasing process complexity and device density. A problem area in IC chip manufacturing is achieving the dwindling feature sizes necessary to accomplish greater device densities. The meaning of the term "devices" here comprises all the desirable electrical circuit elements to which those skilled in the integrated circuit arts seek to achieve on their chips. For example, active elements like transistors and diodes, passive elements such as capacitors and resistors, or the substrates, metal wires and insulators used to connect the above into circuits. These devices area built up from the formation of three-dimensional features which have both horizontal and vertical dimensions. Examples of device features would be bases, emitters, collectors, gates, sources, drains, contacts, trenches, reach-throughs, buried straps, local interconnects, first level metal, inter-level dielectric, stud, via, and so on as understood by those skilled in the art. The features are made by applying design patterns to sequential layers. The design patterns control the horizontal dimensions of a feature as defined by the mask art; while the layers control the vertical dimensions of a feature by way of carefully defined process recipes.

As lithography advances allow device features to shrink their dimensions horizontally, control of the attendant vertical dimensions becomes increasingly difficult and important. While test structures for in-line monitoring of horizontal process parametrics has long been the norm, the same has not been true for vertical process parametrics, particularly for in-line process monitoring. There are a number of techniques used for controlling the horizontal dimensions and profile of integrated circuit devices. An important example is optical metrology, where optical measurement techniques involving microscopes, SEM's, TEM's and the like, measure minimum size features found on comb structures included in the mask art. These structures are placed in an area of open chip or wafer real estate. This is typically in the kerf area of the wafer but may also include partial chip site locations, any open area within the chip, or any other open and available real estate on the wafer. These comb structures are typified by ordered columns of fingers. The fingers are at a minimum width and spaced from one another at the minimum space as allowed by the lithography technology employed in building that chip. Optical or electron microscopy measurement of these combs, as exposed on a wafer, allows timely feedback for the control of horizontal feature dimensions. The advantage provided here is that this measurement technique is non-invasive and non-destructive of the wafer and chips. It allows measurement to be made in-line, along side of (or even in) the processing tool which created the horizontal feature dimension. This allows process and exposure variations to be compensated for in a timely manner. As a result, less product gets mis-processed and identified as scrap. Vertical parametric control, however, must rely upon less desirable methodologies.

The measurement for parametric control of vertical features generally relies upon chip cross-sectioning and reverse engineering techniques. A sampling plan is implemented. A sacrificial wafer is selected from a given wafer lot each time the lot passes through a selected process step in the manufacturing line. The sacrificial wafer is cut apart and the edge polished to expose a vertical profile which can be measured with SEM or TEM equipment. This is a time-consuming process performed off-line in another facility. Meanwhile, the wafer lot continues through the processing line. So, if a wafer lot was mis-processed, additional cost is incurred processing a bad lot. Even when there is no mis-processing, a wafer of product is lost to measurement.

There are various combinational techniques which can be used to avoid chip cross-sectioning. As an example, on levels which are conductive, measurements taken of sheet resistance structures can be used in combination with the horizontal parametrics measurements to infer the vertical thickness achieved for that level on that wafer. However, when the result is not as expected, it is very difficult to determine the exact type of mis-processing. A common problem involves the underlying topography, namely, variance from substantial planarity as needed in the processing of subsequent layers. It is unknown whether the unexpected increase in sheet resistance results from too thin a layer of material as deposited, or because there is an underlying topography disruption along the path of the sheet resistance structure. Such a topography disruption can cause localized thinning in the structure and thus result in an increase to the resistance measurement. Further, some topography disruptions will cause shorts to occur instead, thus resulting in clearly erroneous results, without indication of what might be wrong. So again, cross-sectioning of a sacrificial wafer must be relied upon to discover the mis-processing problem. This is a problem particularly for a process like Damascene which requires substantial planarity from the underlying topography.

Damascene is a process used to provide the metal interconnects on IC chips. An exemplary example of a Damascene method is described in U.S. Pat. No. 4,789,648 to Chow et al., the disclosure of which is incorporated by reference herein. In its essence, producing IC wiring interconnect with Damascene involves first providing a planarized layer of insulator. Second, a channel is etched in the planarized layer where interconnect wires are desired. Third, metal is deposited to cover over and fill the channels. Finally, excess metal which overlies the insulator is removed with a chemical mechanical polish technique to isolate the metal in the channels and coplanarize the surface. An exemplary example of chemical mechanical polishing is described in U.S. Pat. No. 4,944,836 to Beyer et al., the disclosure of which is incorporated by reference herein.

There are problems which can manifest themselves in a Damascene-like process. One, as discussed above, is where topography problems cause the surface of the insulator to vary from the essential coplanarity and, as such, not all deposited metal gets polished off by the chemical mechanical polishing. Another problem is when a scratch develops on the surface of the insulator prior to the metal deposition. This may be the result of simple wafer mishandling or result from particulate contamination in the chemical mechanical polishing step. Another problem found with a Damascene process is where an over-polishing condition results from a variation in pattern factor of the underlying metal line widths or other topography found across the chip.

The pattern factor is the ratio of metal to total (insulator plus metal) area for a given region of the chip, as view from above, where area is in the plane of the chip surface. It is expressed as a percentage of metal area divided by the total chip area in the chip region that includes the metal shapes of interest. Different pattern factors result as a consequence of the variation in metal line widths and line densities found across a chip site. Metal lines used as signal carriers are typically at the minimum feature size width allowed for that level of metal and for a given process technology. Metal lines used to supply circuit power from the voltage supplies are made wide by design. This results from a need to minimize any voltage drop seen between the power supply and the destination circuit. This need is best achieved by keeping the metal resistance as low as possible, which in turn, means making the power supply metal line widths as wide as possible.

FIGS. 1A–E depict how topography variation may affect a Damascene process. In FIG. 1A, an insulator 10 has been pattern etched and covered with deposited metal 11. This deposited metal is chemically mechanically polished back until narrow wires 12 and wide wires 13 are formed as depicted in FIG. 1B. Note that dishing (e.g. a concave or non-coplanar area) has formed on wide wires 13. This result is from a local over-polishing condition caused by the local compliance of the polish pad and the difference in polish rates for metals and insulators. In FIG. 1C, a conformal insulator 14 has been applied on the wafer. Note that the conformal insulator has replicated the dishing of wide lines 13 to the surface. Etching of channels 15 is shown in FIG. 1D as preparation to creating second level metal wires. In FIG. 1E, the channels 15 have been filled with deposited metal and this metal has been polished back to form second level wires 16 and 17. However, wires 17 were formed over the topographical dishing caused from over-polishing of wide wires 13. As a result, the metal is not entirely removed from between the wires 17 as was desired and a metal puddle 18 is formed which shorts the wires 17 together. While the example used in FIGS. 1A–E depicts an over-polish topography problem, there are other topography perturbations which may cause similar results. These include but are not necessarily limited to topography problems from scratching, particle contamination, mishandling and mis-processing in fabrication. These topography deviations can either be negative or positive (i.e. concave or convex), leading to shorts or opens, respectively, for metal lines on subsequent wiring levels.

Therefore, there exists a demand for chip testing in a manufacturing environment which is both timely, and yet provides an improved quality and quantity of test results. There also exists a demand for vertical parametric in-line test structures. Also, there is a demand for on-wafer topography monitors which will indicate topography problems in the fabrication of IC wafers. Lastly, there is a demand for a wafer test structure to monitor dishing resulting from scratches and over-polish conditions. Thus, it would be desirable to provide a means for satisfying such demands and solving the aforesaid and other deficiencies and disadvantages.

SUMMARY OF THE INVENTION

It is therefore an object of the present invention to provide timely indication of integrated circuit topography variations which exceed an allowable tolerance range.

Another object of the invention is to provide indication of metal shorts or opens resulting from dishing, particles, bumps, or scratches created in prior processing.

Yet another object of the present invention is to furnish indication of metal shorts or open yields as a function of the underlying topography and pattern factors.

Still yet another object of the present invention is to provide indication of metal or conductor shorts resulting from mishandling and scratching of a wafer.

In accordance to the present invention, a topography monitor for an integrated circuit wafer is disclosed which comprises a conductive layer on a substrate. The conductive layer is patterned by a design intended to produce two separate runs of conductor and where each run of conductor is in close proximity to the other.

Furthermore, a topography monitor for an integrated circuit chip is disclosed which comprises a conductive layer upon topography of interest. The conductive layer is patterned with a design intended to produce two runs of conductor in close proximity to each other. The conductors run over and are in registration with the underlying topography of interest. The topography of interest has a pattern factor variation corresponding to product area found elsewhere on the wafer.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

Figure 1A:
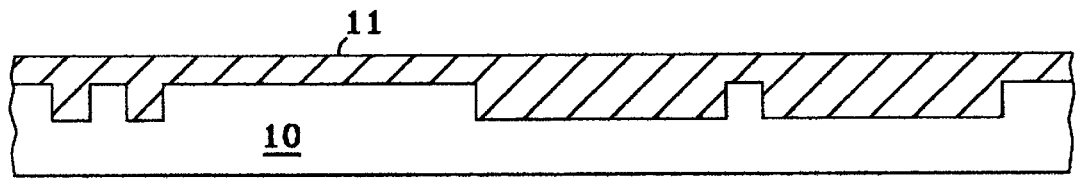
FIGS. 1A–E illustrate an example of mis-processing which results in a metal shorts condition.
Figure 1B:
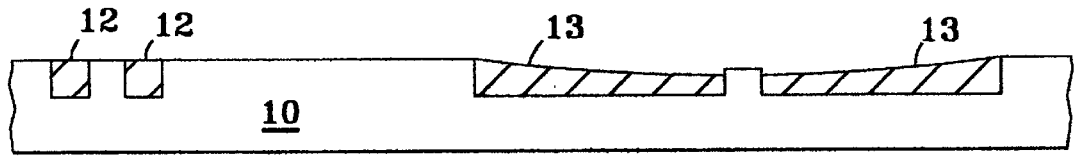
Figure 1C:
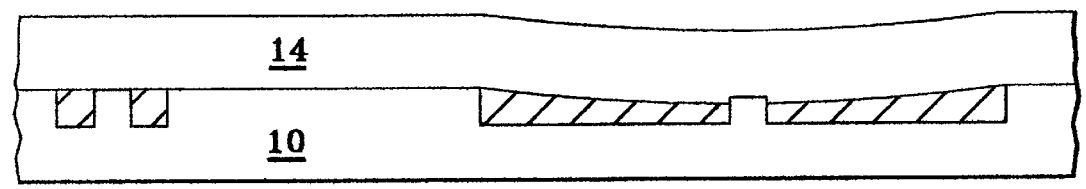
Figure 1D:
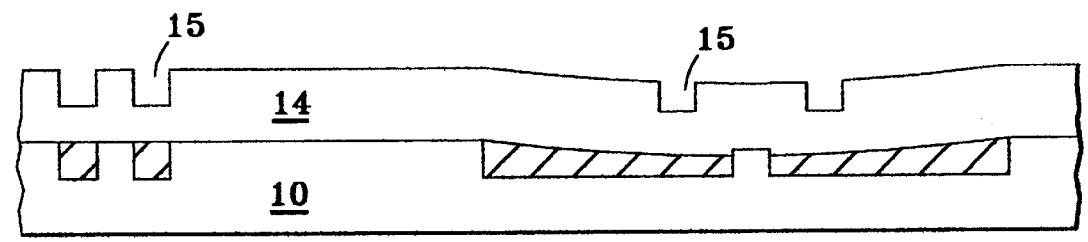
Figure 1E:
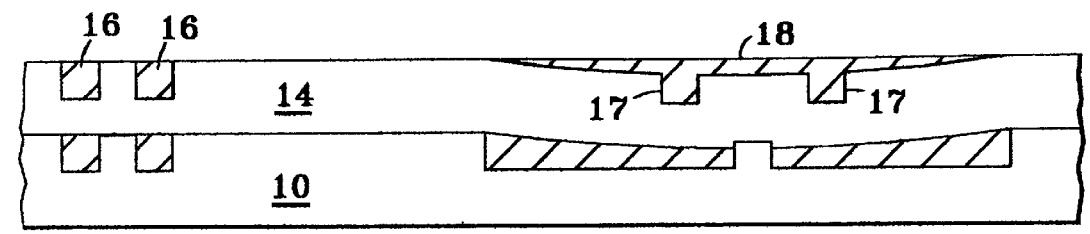
Figure 2:
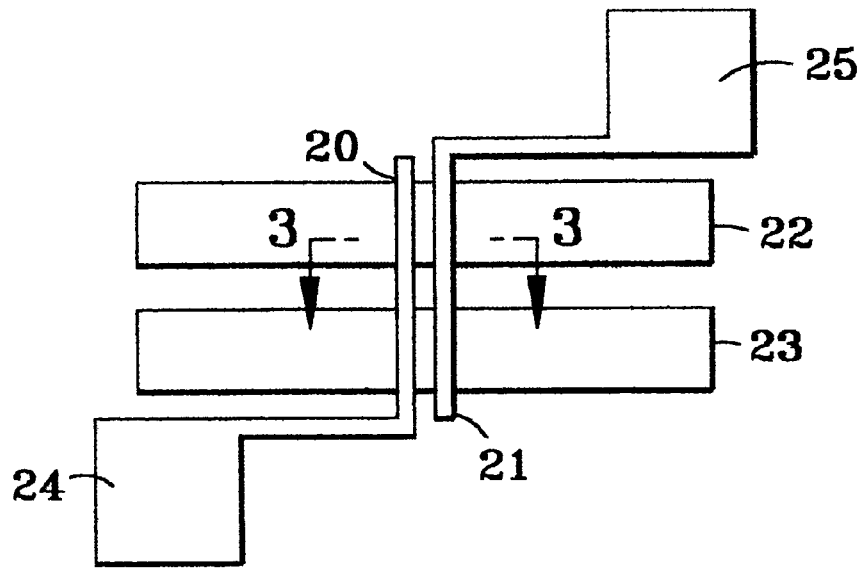
FIG. 2 illustrates a schematical depiction of the invention.

Referring to FIG. 2, according to the present invention, there is shown a simplified schematical representation of the invention comprising: a first run of conductor 20, a second run of conductor 21, topography items 22 and 23, and probe pads 24 and 25. The first and second runs of conductor 20 and 21 are typically made of metal. This includes copper, aluminum, tungsten, cobalt, silver etc. and includes alloys as well as composite layers thereof. The runs of conductor 20 and 21 may also be made of polysilicon or any other conductor type commonly found in the production of integrated circuit chips. Conductor runs 20 and 21 may be formed by etching a channel into a conformal insulator. Conductive material is deposited and then polished, ground or etched back to remove the excess. This results in both the removal of excess conductive material and a substantially coplanar surface. The conductor runs 20 and 21 are arranged to run substantially parallel to each other, and preferably with the minimum allowable spacing between them as permitted by the fabrication process with which they are built.

The first and second runs of conductor 20 and 21 pass over topography items 22 and 23, from which they are separated by a dielectric layer of conformal insulator. A preferred arrangement puts the direction of the conductive runs orthogonal to the direction of the underlying topography, as is depicted in FIG. 2. The underlying topography items may be conductors or any other type of device typically found on a wafer or integrated circuit chip. The underlying topography may be actual active product area on the chip or it may be made up of mock devices to simulate a chip area of interest. A preferred embodiment presents a range of pattern factors to monitor.

Pattern Factor is determined for a given area of interest. An area of interest contains both shapes and the spaces between the shapes. A pattern factor is an expression used to describe the area amount of shapes relative to the amount of space. It is defined as the percentage ratio of the total shape area to the total area of interest. For example, a pattern factor of 50% signifies equal area amounts of both shapes and spaces. An area of interest filled with a repeating series of lines, where each line is one micron wide and separated by a one micron space would display a pattern factor of 50%.

Presenting a range of different pattern factors allows the topography monitor to indicate not just a process failure but also indicate for what range of topography pattern factor the failure has occurred. This is of particular help where the failure mode is the result of over polishing conditions and, as such, provides improved feedback to operations. It is, however, of less benefit when the failure mode is the result of scratching. A preferred embodiment presents a range of pattern factors considered the allowable range for a given fabrication process. In another preferred embodiment, the arrangement and order of the topography items is representative of the topography range found in the actual chip product active area. For either embodiment, a pattern factor range within a second of 50% to 95% is anticipated.

Probe pads 24 and 25 are provided as a means for supplying electrical connection to the first and second conductive runs 20 and 21, respectively. As such, they are conductively coupled to each respective conductive run as an aid to hooking up a power supply and electrical monitoring equipment. However, any means for supplying electrical connection may be used such as flying wire bond, lead-tin ball grid arrays, or contactless probes, to list a few examples.

Figure 3A:
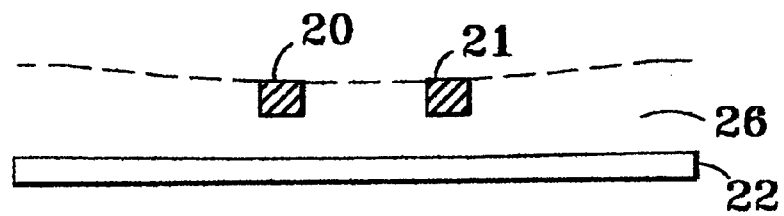
FIG. 3A–B illustrate a cross-section of the schematical depiction of the invention shown in FIG. 1, both as properly processed as shown in FIG. 3A and in FIG. 3B as improperly processed.
Figure 3B:
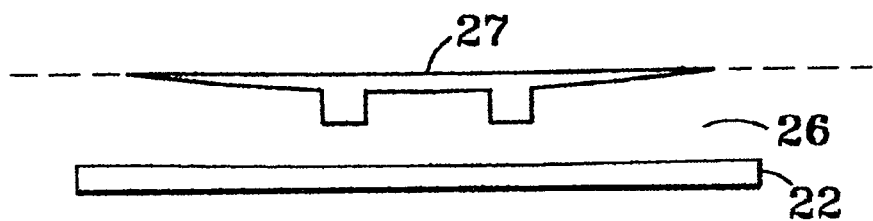

Both FIGS. 3A and 3B depict the invention in a cross-section taken through line 3—3 of FIG. 2. FIG. 3A depicts the result of normal processing, and FIG. 3B depicts the situation where mis-processing due to an over polish condition has occurred. First and second conductor runs 20 and 21 are shown embedded in conformal dielectric insulator 26. Insulator 26 keeps the conductor runs above and isolated from topography item 22. In FIG. 3B, over-polishing of topography item 22 has resulted in the formation of puddle 27. Puddle 27 causes conductor runs 20 and 21 to be shorted to one another. As can now be understood, the first and second conductor runs 20 and 21 are intended by design to be separate from each other. The mask art as designed reflects this intention. However, when mis-processing of a significant enough degree occurs, the conductor runs are shorted by puddle 27.

Figure 4:
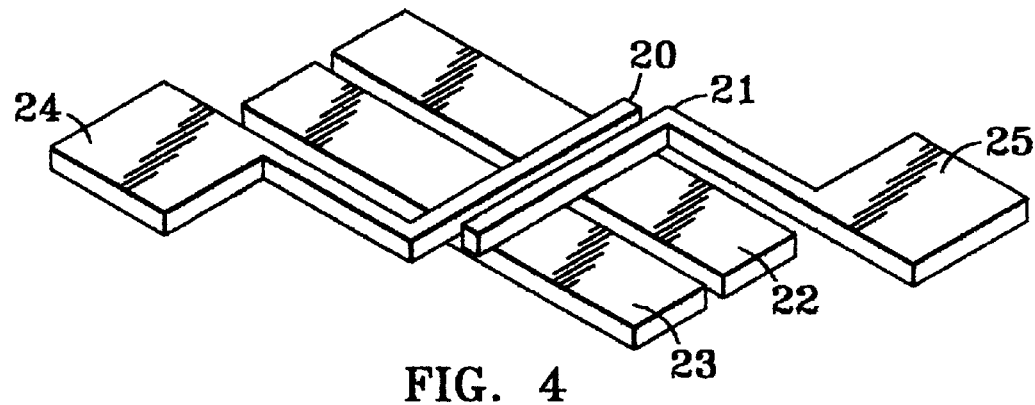
FIG. 4 illustrates a three-dimensional, perspective drawing of the schematical depiction of the invention.

FIG. 4 is a three-dimensional rendering of the invention as depicted in FIGS. 2 and 3A. It is provided as an aid to visualizing and understanding the invention.

In operation, the topography monitor has a voltage applied from across first conductive run 20 to second conductive run 21 via probe pads 24 and 25, while observing the current. If successful processing has occurred, no puddle will have formed and the current draw will be negligible indicating the intended open condition between the conductive runs 20 and 21. However, if a puddle 27 in FIG. 3B has formed, the first conductive run 20 will be shorted to second conductive run 21 and substantial current will be drawn from the power supply. In fact, the supply used to apply the voltage should be current limited in the event that the puddle 27 is the result of scratching. This is because scratching tends to produce very small puddles which are like a filament or whisker of conductor. As such, these scratch-induced puddles can be burned open like a failing fuse if too much current is allowed to flow. If burned open, indication by the topography monitor of mis-processing may be missed.

Figure 5:
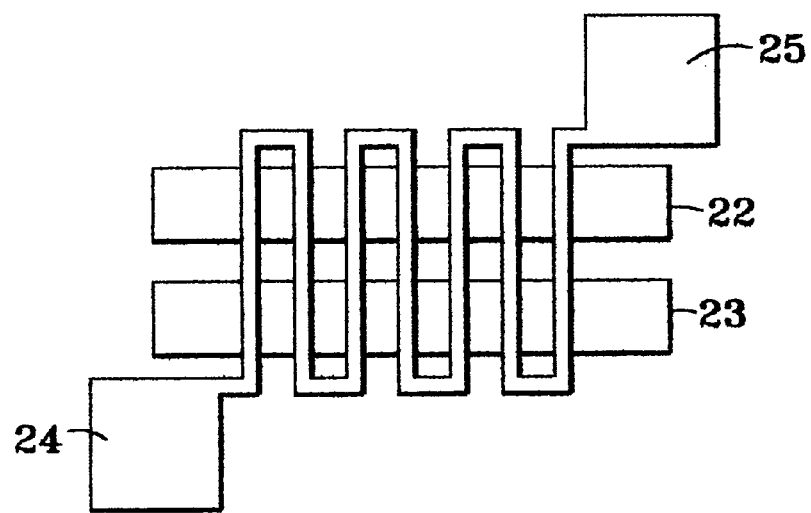
FIG. 5 illustrates an alternate schematical embodiment of the present invention.

It should be noted that the invention may be embodied in another manner as is depicted schematically in FIG. 5. Runs of conductor may be strung together in series, with probe pads 24 and 25 provided for sensing at each end. A resistance measurement may then be made. If a puddle has been formed, the resistance value will be lower in value than the normal expected resistance and thereby indicate mis-processing. This approach may be considered as less desirable for an in-line testing situation where the simple go/no-go operation of an open-shorts test is to be preferred.

Figure 6:
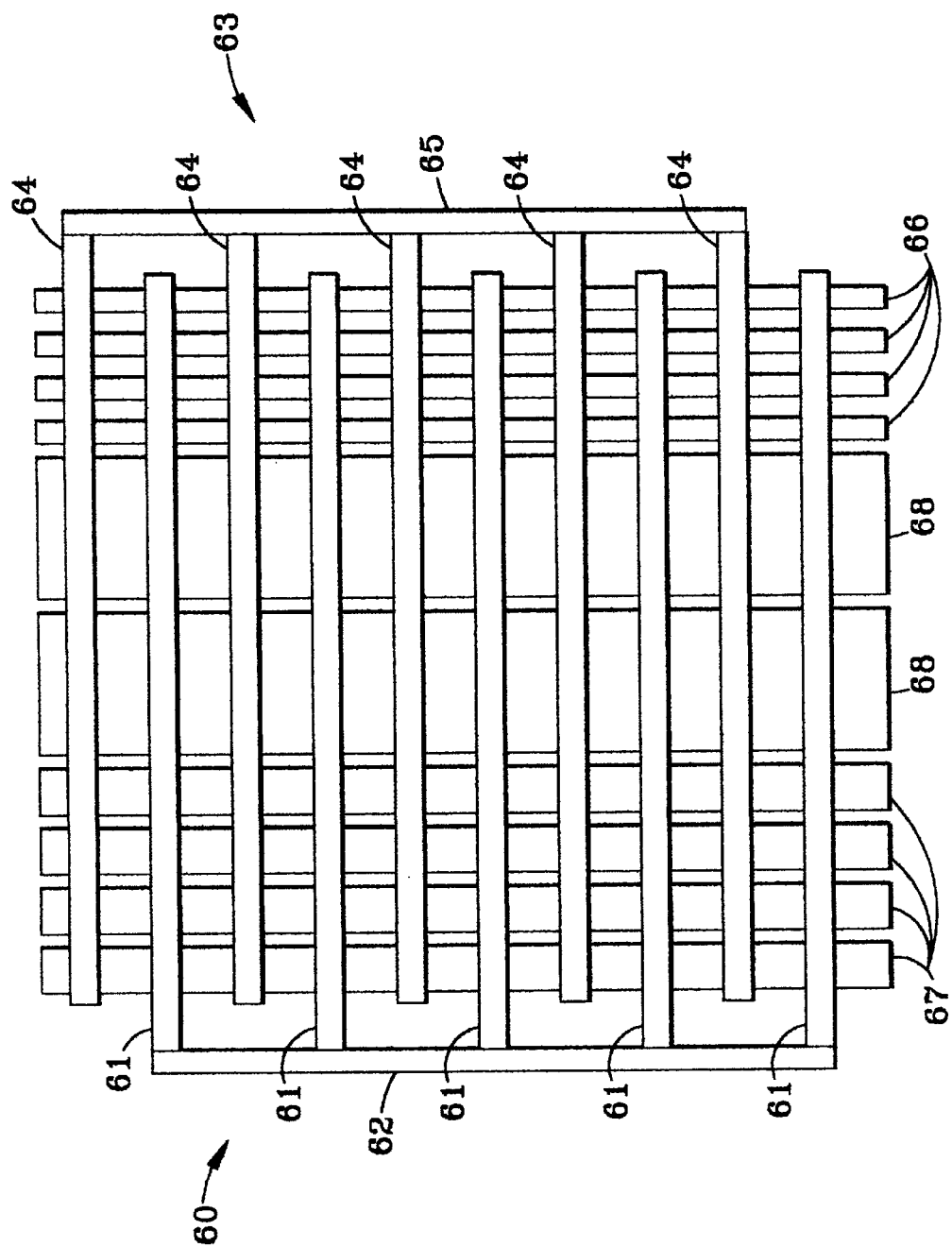
FIG. 6 illustrates a preferred embodiment of the present invention.

FIG. 6 depicts a preferred embodiment of the topography monitor. Alternating runs of conductor are arranged in combs of interdigitated fingers. Comb structure 60 is comprised of runs of conductor 61 and strap 62 which connects the runs of conductor 61 together as a series of fingers. Similarly, comb structure 63 is comprised of runs of conductor 64 and strap 65. Comb structure 60 is arranged so that it is interdigitated with comb structure 63 as shown in FIG. 6. Runs of conductor 61 are alternated with runs of conductor 64, and for a preferred embodiment are of minimum width and minimum space from each other as allowed by the fabrication technology with which they are built. The runs of conductor 61 and 64 are placed in registration with underlying topography items 66, 67 and 68, being separated from them by a layer of conformal dielectric insulator. Topography items 66 depict a narrow width, items 67 a medium width, while topography items 68 are wide.

Figure 7:
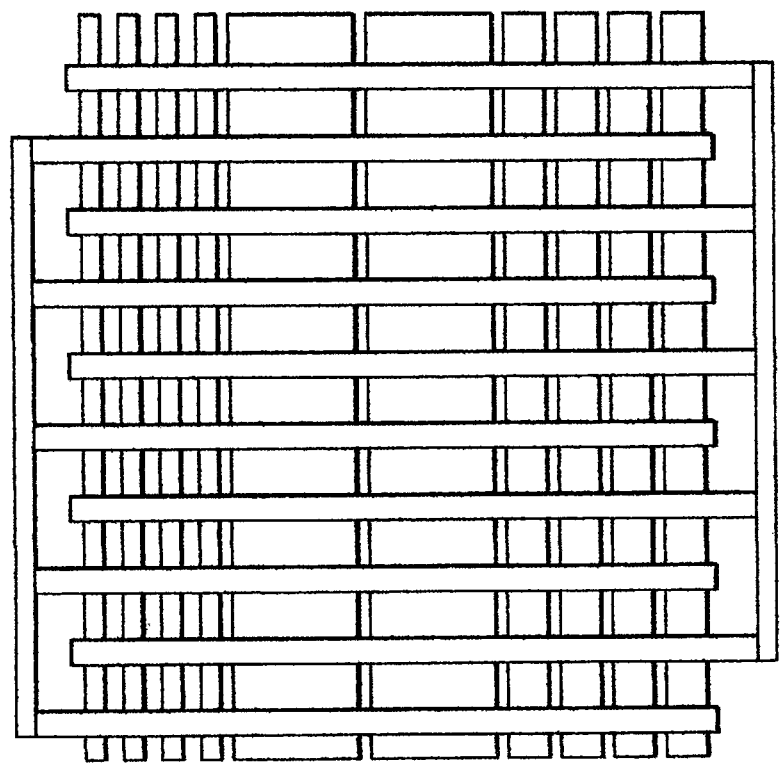
FIG. 7 illustrates the invention repeated and rotated.
Figure 7:
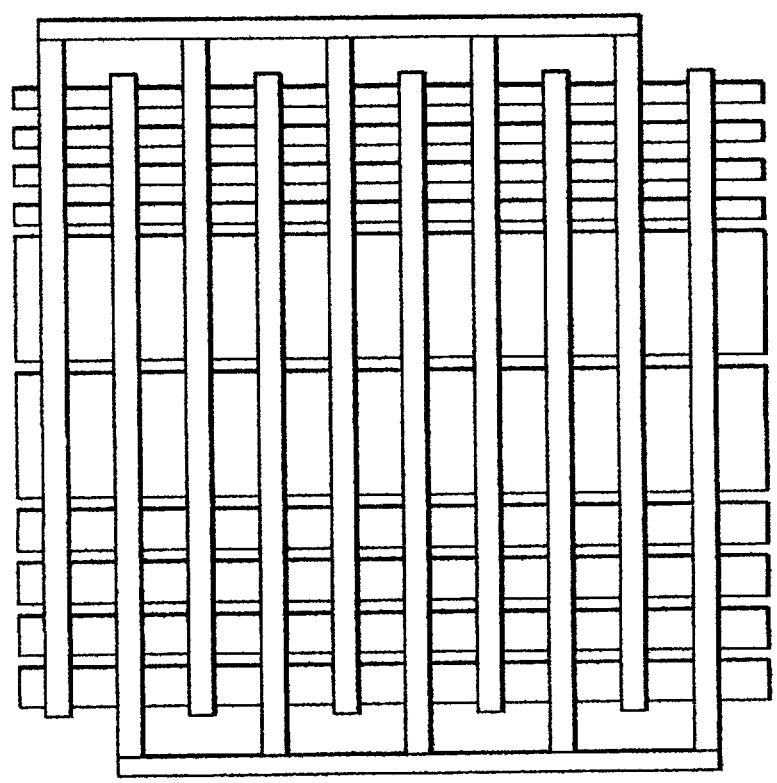

The topography monitor exhibits a greater sensitivity to topography or scratches which run perpendicular to the runs of conductor found in the monitor. To overcome any insensitivity to topography or scratches which might be otherwise missed, the monitor may be replicated and rotated 90 degrees as depicted in FIG. 7.

Figure 8:
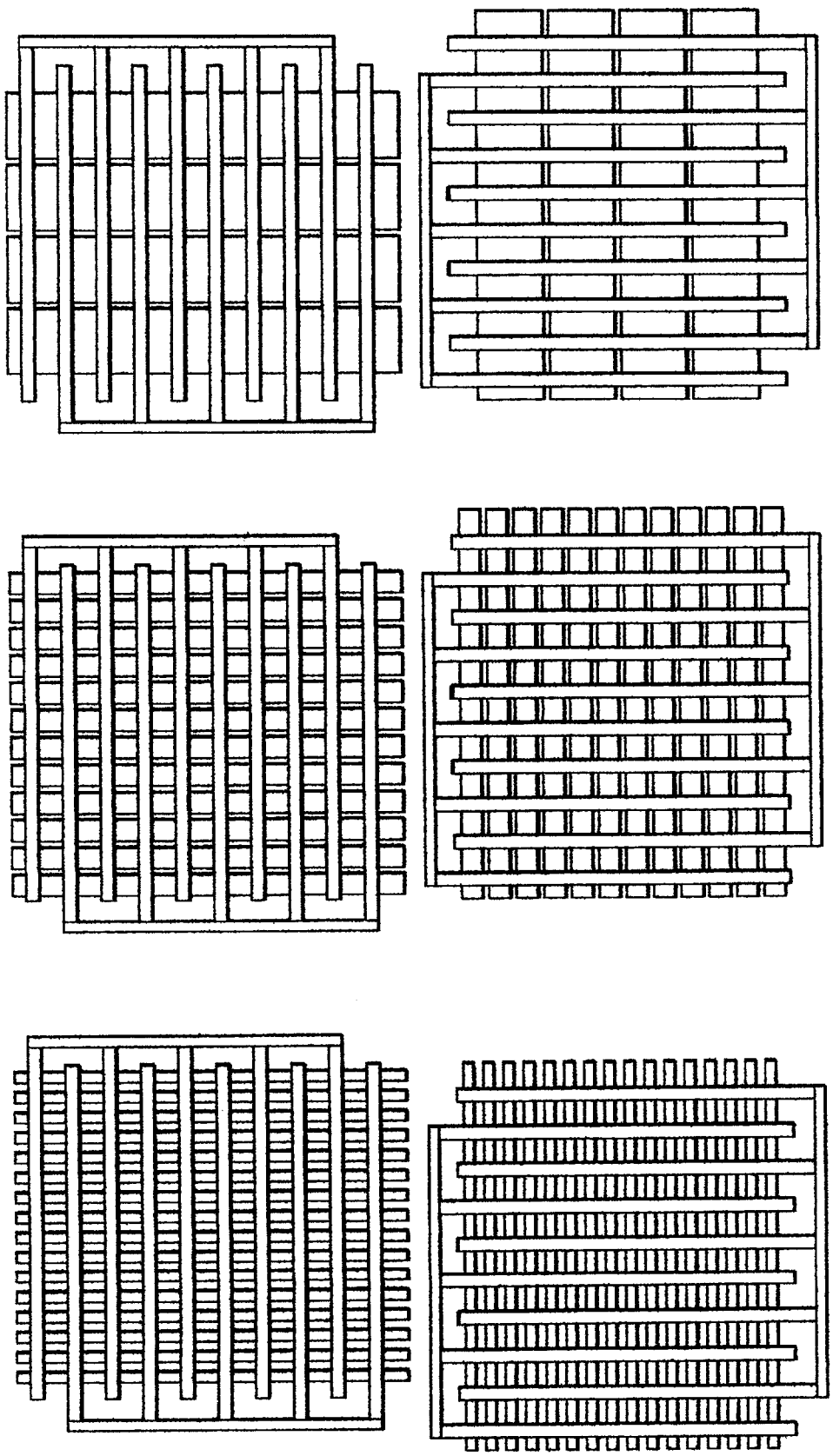
FIG. 8 illustrates the invention repeated with underlying topography in a single type of pattern factor for each structure.

In monitoring for over-polishing conditions, it may be desirable to have an indication of at what width of topography shorts are developing. This would give operations an indication of the degree that the wafers are being over polished. This is achieved with the invention by isolating one width of topography items in a monitor and another width in another monitor as shown in FIG. 8. An individual topography monitor is provided for narrow, medium and wide items. Each is electrically isolated and separately available for probing. Again, as discussed above, each monitor is repeated and rotated to capture equal sensitivity to scratches running in any direction.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed:

1. A topography monitor for an integrated circuit chip wafer comprising:

an area of topography, a conformal insulator layer applied over the area of topography, and a conductive layer fabricated as a pattern in the conformal insulator layer, where the pattern is intended by design to produce two or more runs of conductor in registration with the area of topography and in close proximity to each other, wherein a depression in the area of topography causes a resistance between two runs of conductor overlying the depression to be lower than a resistance between two runs of conductor when no defect is in the area of topography.

2. The topography monitor for integrated circuits of claim 1, where each of the two or more runs of conductor are electrically connected serially and as such represent one electrical node.

3. The topography monitor for integrated circuits of claim 1, wherein each of the two or more runs of conductor are by design intent electrically isolated from each other and as such represent two or more electrical nodes.

4. The topography monitor for an integrated circuit chip wafer of claim 1, wherein the area of topography presents a range of topography representative of that found across the integrated circuit chip wafer.

5. The topography monitor for an integrated circuit chip wafer of claim 1, wherein the area of topography presents a pattern factor range of 50 to 100 percent.

6. The topography monitor for an integrated circuit chip wafer of claim 1, wherein the area of topography presents a pattern factor of 65 to 95 percent.

7. The topography monitor for an integrated circuit chip wafer of claim 1, wherein the area of topography is polished prior to the application of the conformal insulator layer.

8. The topography monitor for an integrated circuit chip wafer of claim 1, wherein the area of topography is rendered coplanar by a chemical-mechanical polishing technique prior to the application of the conformal insulator layer.

9. The topography monitor for an integrated circuit chip wafer of claim 1, wherein the area of topography is rendered coplanar by an etching technique prior to the application of the conformal insulator layer.

10. A topography monitor for monitoring a process profile in an area of topography comprising:

a substrate, an area of topography upon the substrate, a conformal insulator layer applied over the area of topography, and a conductive layer fabricated as a pattern upon the conformal insulator layer, where the pattern is intended by design to produce two or more runs of conductor in registration with the area of topography and in close proximity to each other and running over the area of topography, wherein the electrical characteristic of the runs of conductor indicates the process profile, so that a depression in the area of topography causes a resistance between two runs of conductor overlying the depression to be lower than a resistance between two runs of conductor when no defect is present in the area of topography.

11. The topography monitor for monitoring a process profile in an area of topography of claim 10, wherein the area of topography comprises one or more of the layers found in the fabrication of an integrated circuit device.

12. The topography monitor for monitoring a process profile in an area of topography of claim 10, wherein the area of topography comprises one or more of the layers found in the interconnection of integrated circuit devices.

* * * * *